(12) United States Patent
Wong et al.

(10) Patent No.: US 10,810,332 B2
(45) Date of Patent: Oct. 20, 2020

(54) METHOD, APPARATUS, AND COMPUTER PROGRAM PRODUCT FOR SIMULATING CLIENT AND APPLICATION INTERFACE INTEGRATION

(71) Applicant: Change Healthcare Holdings, LLC, Nashville, TN (US)

(72) Inventors: Eldon Wong, Vancouver (CA); Eyal Alon, Vancouver (CA); Mark Genshaft, Richmond (CA); Sam Wong, Vancouver (CA)

(73) Assignee: Change Healthcare Holdings, LLC, Nashville, TN (US)

( * ) Notice: Subject to any disclaimer, the term of this patent is extended or adjusted under 35 U.S.C. 154(b) by 709 days.

(21) Appl. No.: 15/475,979

(22) Filed: Mar. 31, 2017

(65) Prior Publication Data
US 2018/0285490 A1    Oct. 4, 2018

(51) Int. Cl.
*G06F 30/20* (2020.01)
*H04W 24/06* (2009.01)

(52) U.S. Cl.
CPC ............ *G06F 30/20* (2020.01); *H04W 24/06* (2013.01)

(58) Field of Classification Search
CPC ...... G06F 17/5009; G06F 9/542; G06F 30/20; H04W 24/06

USPC .......................................................... 726/6
See application file for complete search history.

(56) References Cited

U.S. PATENT DOCUMENTS 8,869,174 B2 * 10/2014 Wong .................. G06F 11/3476
                                                              382/128
2018/0129519 A1 * 5/2018 Bharadwaj ............. H04L 67/10

* cited by examiner

*Primary Examiner* — Eunhee Kim
(74) *Attorney, Agent, or Firm* — Meunier Carlin & Curfman LLC

(57) ABSTRACT

A method is provided for simulating communication between a client system and application entity via an application interface, thereby enabling integration testing with a simulation apparatus. Data is transmitted from the simulation apparatus to the application entity via the application interface, and the simulation apparatus records outputs along with contexts and respective latencies. The client system transmits requests to the simulation apparatus which returns simulated responses based on the stored outputs having similar contexts, and with artificial latencies replicating the previously recorded latencies. Other events generated in the application entity may also be recorded and simulated accordingly. Reporting and analytical data may be provided to identify potential performance issues and other errors prior to direct integration of the client system and application interface.

20 Claims, 5 Drawing Sheets

METHOD, APPARATUS, AND COMPUTER PROGRAM PRODUCT FOR SIMULATING CLIENT AND APPLICATION INTERFACE INTEGRATION

TECHNOLOGICAL FIELD

Embodiments of the present invention relate generally to computer technology and, more particularly, to methods, apparatuses, and computer program products for simulating communication between a client system and application entity via an application interface.

BACKGROUND

Many computer applications utilize entities such as third party systems, services, or applications that operate externally from the application's environment. In order to access these entities, a client or requesting system utilizes an interface generated by the entity. However, variables on both the client and third party system may impact the client's ability to interface with the third party system as intended. Integrating the client system with the application interface without properly testing the environment may result in performance issues and other errors. To accurately test interactions between the client and remote application entity with the interface, dependencies relating to the hosting environment, available bandwidth, and/or the like should be applied during testing.

BRIEF SUMMARY

Methods, apparatuses, and computer program products are therefore provided for simulating communication between a client system and application entity via an application interface. In some approaches, a mock of an entity can be created to abstract out the actual implementation and/or dependency details and to more accurately control the data in the tests. This approach may introduce some challenges. Client systems may likely have no relation with one another, and may need to create their own specific mocking implementation for the interface. To more accurately generate mock data, clients may need to understand the internal design and/or implementation details regarding the application entity with which it interfaces. However, the mocked data may be generated such that "one size fits all," and may not accurately reflect the actual environment of the application entity. Further, implementing a client system that supports mocking and has appropriate data is complicated, difficult to maintain, expensive, and time consuming. The example embodiments provided herein therefore simulate communication between a client system and application entity via an application interface, allowing testing of the integration between simulated entities.

A method is provided for simulating communication between a client system and an application entity via an application interface. The method includes accessing a set of input parameters and a scheduling configuration and transmitting a plurality of requests to the application entity via the application interface according to the scheduling configuration, wherein the plurality of requests comprise respective input parameters. The method further includes monitoring for responses from the application interface and storing received output data and respective latency times in association with respective request records, wherein the request records correspond to requests and comprise at least the input parameters and context data. The method further includes projecting the application interface for access by the client system. The method further includes, in response to a client request from the client system, identifying at least one request record as a representative record. The method further includes causing a simulated response to be provided to the client system based on the stored received output and the respective latency time associated with the at least one representative record.

In some embodiments, the method includes tracking events triggered by performance of requests by the application entity, and further in response to the client request from the client system, simulating at least one event. The context data may comprise a temporal characteristic, and the at least one representative record is identified based on the temporal characteristic.

The method may comprise determining an artificial latency based on average latency times of a plurality of representative records, wherein the simulated response is provided based on the artificial latency. The method may further include determining an artificial latency based on a highest latency time of a plurality of representative records, wherein the simulated response is provided based on the artificial latency. In some examples, the method includes providing reporting and analytics data and/or performing anonymization of at least one of the output data.

A computer program product is provided for simulating communication between a client system and an application entity via an application interface. The computer program product comprising at least one non-transitory computer-readable medium having computer-readable program instructions stored therein, the computer-readable program instructions comprising instructions, which when performed by an apparatus, are configured to cause the apparatus to at least access a set of input parameters and a scheduling configuration and transmit a plurality of requests to the application entity via the application interface according to the scheduling configuration, wherein the plurality of requests comprise respective input parameters.

The computer-readable program instructions further include instructions, which when performed by an apparatus, are configured to cause the apparatus to monitor for responses from the application interface, store received output data and respective latency times in association with respective request records and project the application interface for access by the client system. The instructions are further configured to cause the apparatus to, in response to a client request from the client system, identify at least one request record as a representative record, and cause a simulated response to be provided to the client system based on the stored received output and the respective latency time associated with the at least one representative record.

An apparatus is provided for simulating communication between a client system and an application entity via an application interface. The apparatus comprises processing circuitry configured to cause the apparatus to at least access a set of input parameters and a scheduling configuration and transmit a plurality of requests to the application entity via the application interface according to the scheduling configuration, wherein the plurality of requests comprise respective input parameters. The apparatus further includes processing circuitry configured to cause the apparatus to monitor for responses from the application interface and store received output data and respective latency times in association with respective request records.

The apparatus further includes processing circuitry configured to project the application interface for access by the client system, and in response to a client request from the client system, identify at least one request record as a representative record. The apparatus further includes processing circuitry to cause a simulated response to be provided to the client system based on the stored received output and the respective latency time associated with the at least one representative record.

An apparatus is provided for simulating communication between a client system and an application entity via an application interface. The apparatus includes means for accessing a set of input parameters and a scheduling configuration and transmitting a plurality of requests to the application entity via the application interface according to the scheduling configuration, wherein the plurality of requests comprise respective input parameters. The apparatus further includes means for monitoring for responses from the application interface and storing received output data and respective latency times in association with respective request records, wherein the request records correspond to requests and comprise at least the input parameters and context data. The apparatus further includes means for projecting the application interface for access by the client system. The apparatus further includes means for, in response to a client request from the client system, identifying at least one request record as a representative record. The apparatus further includes means for causing a simulated response to be provided to the client system based on the stored received output and the respective latency time associated with the at least one representative record.

The above summary is provided merely for purposes of summarizing some example embodiments of the invention so as to provide a basic understanding of some aspects of the invention. Accordingly, it will be appreciated that the above described example embodiments are merely examples and should not be construed to narrow the scope or spirit of the disclosure in any way. It will be appreciated that the scope of the disclosure encompasses many potential embodiments, some of which will be further described below, in addition to those here summarized.

BRIEF DESCRIPTION OF THE SEVERAL VIEWS OF THE DRAWINGS

Figure 1:
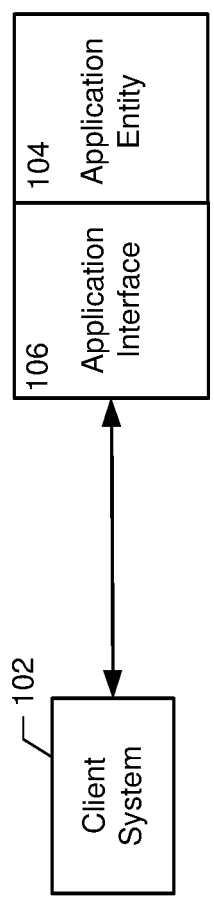
Figure 2:
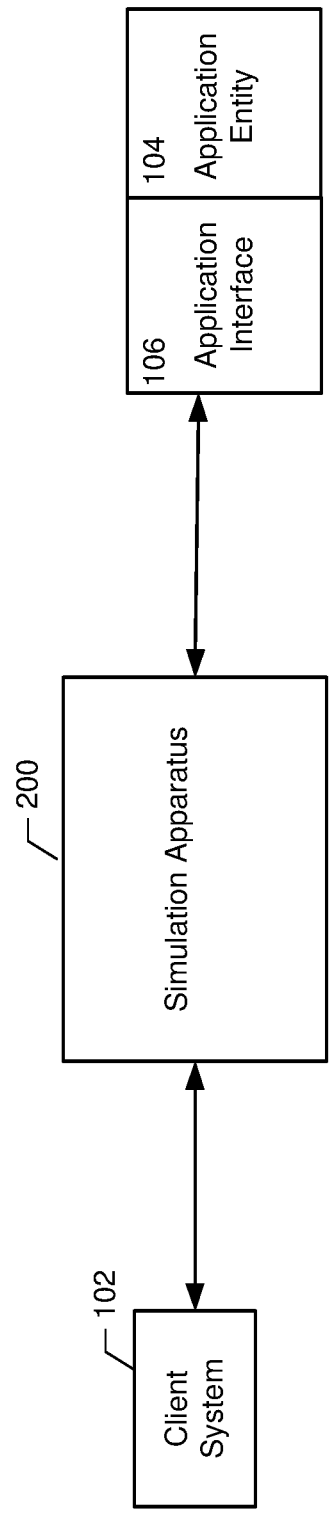
Figure 3:
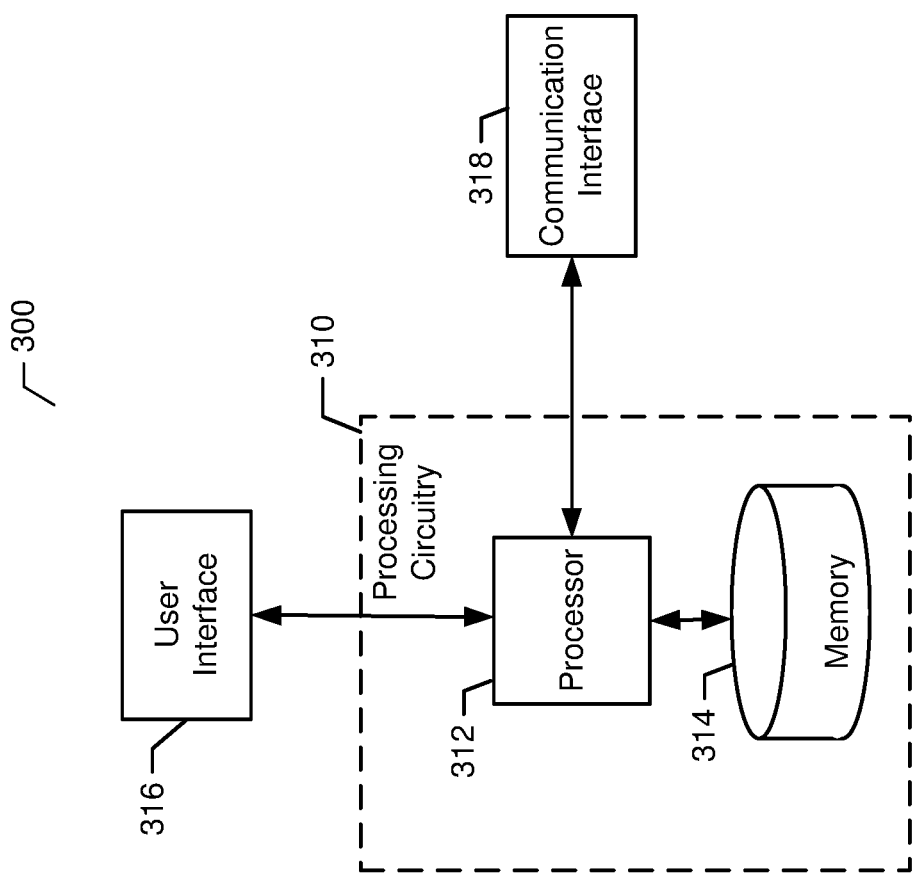

Having thus described embodiments of the invention in general terms, reference will now be made to the accompanying drawings, which are not necessarily drawn to scale, and wherein:

FIGS. 1 and 2 are block diagrams of a system according to some example embodiments;

FIG. 3 is a block diagram of an apparatus according to some example embodiments.

Figure 4:
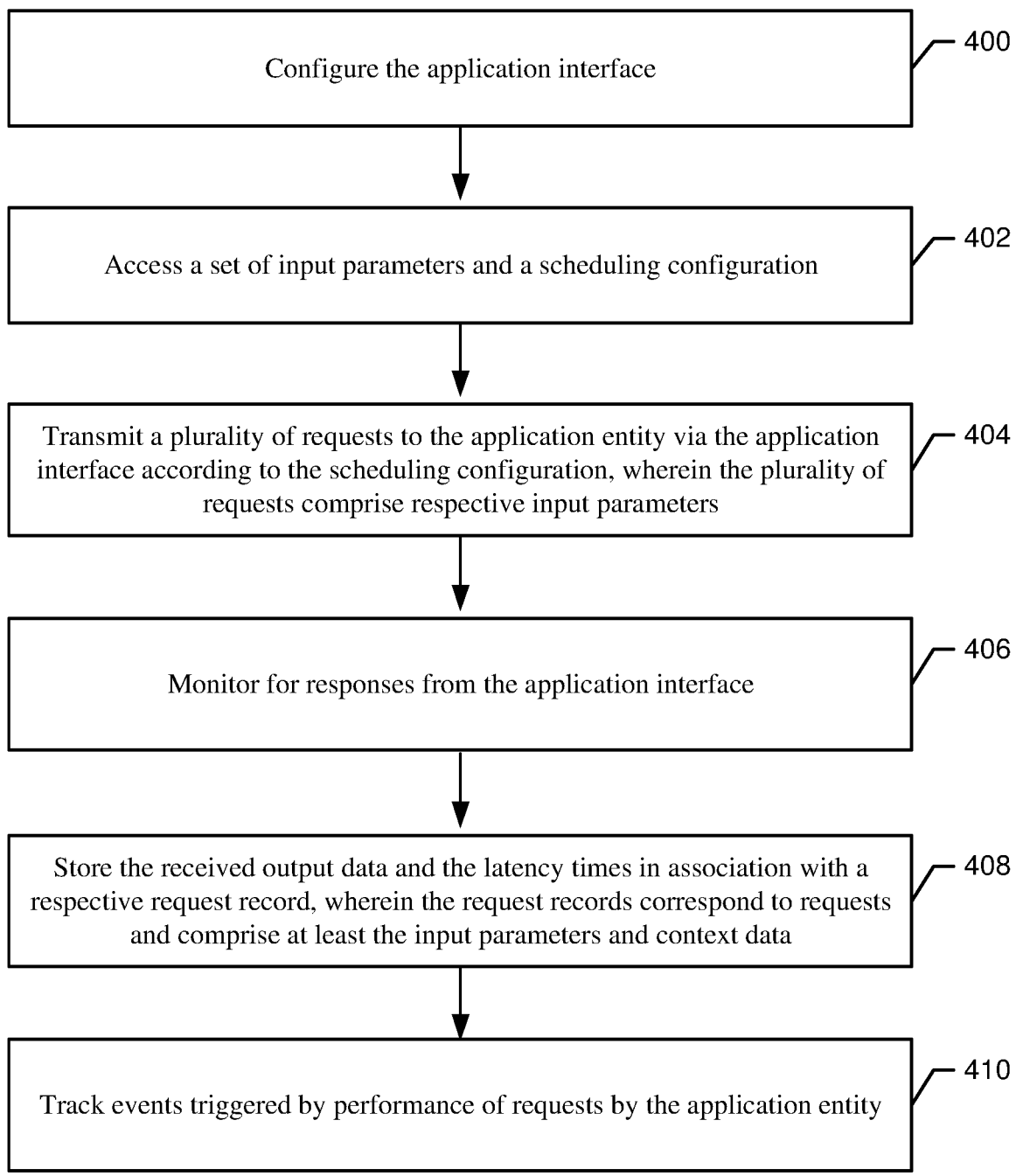
Figure 5:
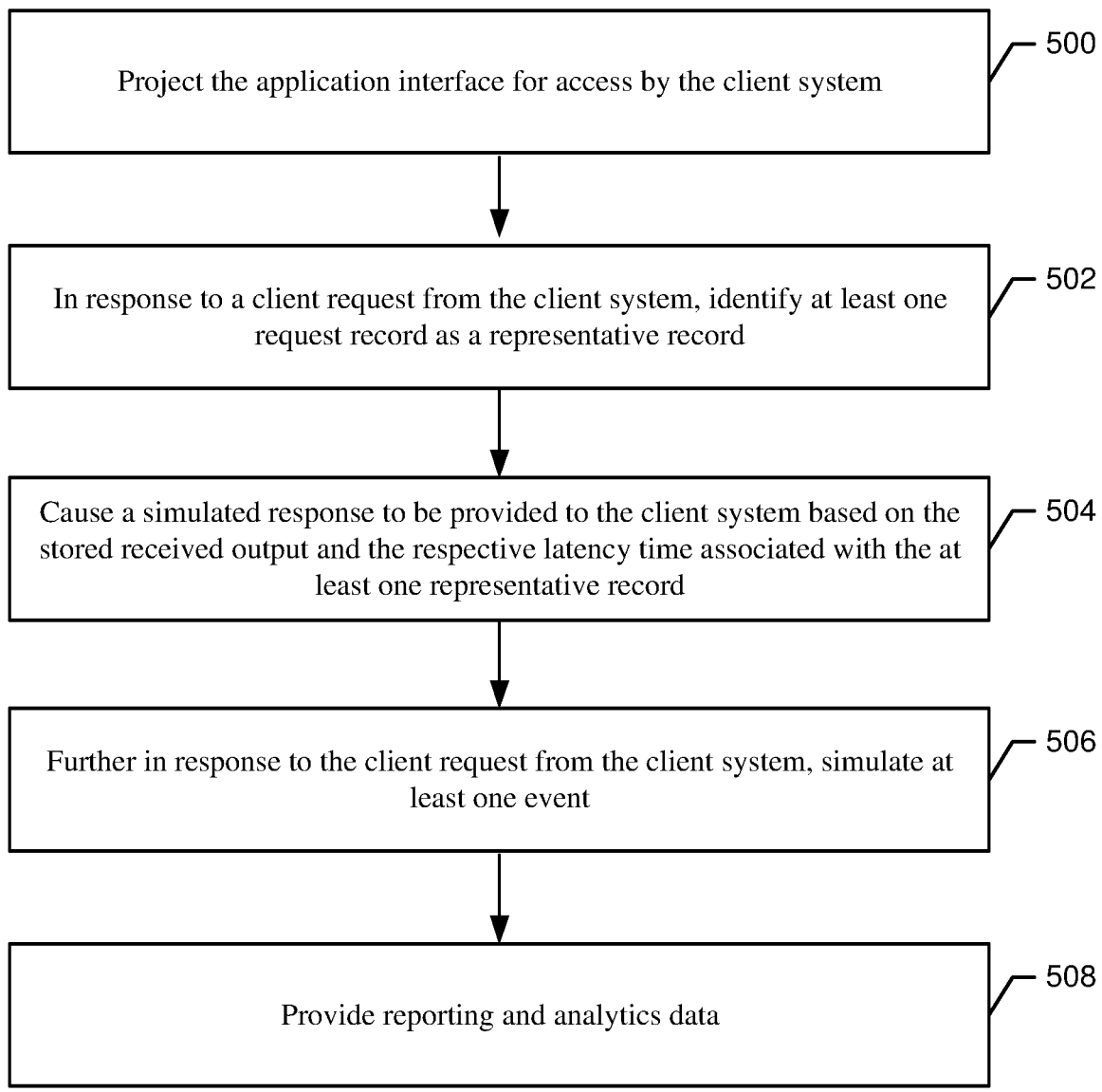
Figure 6:
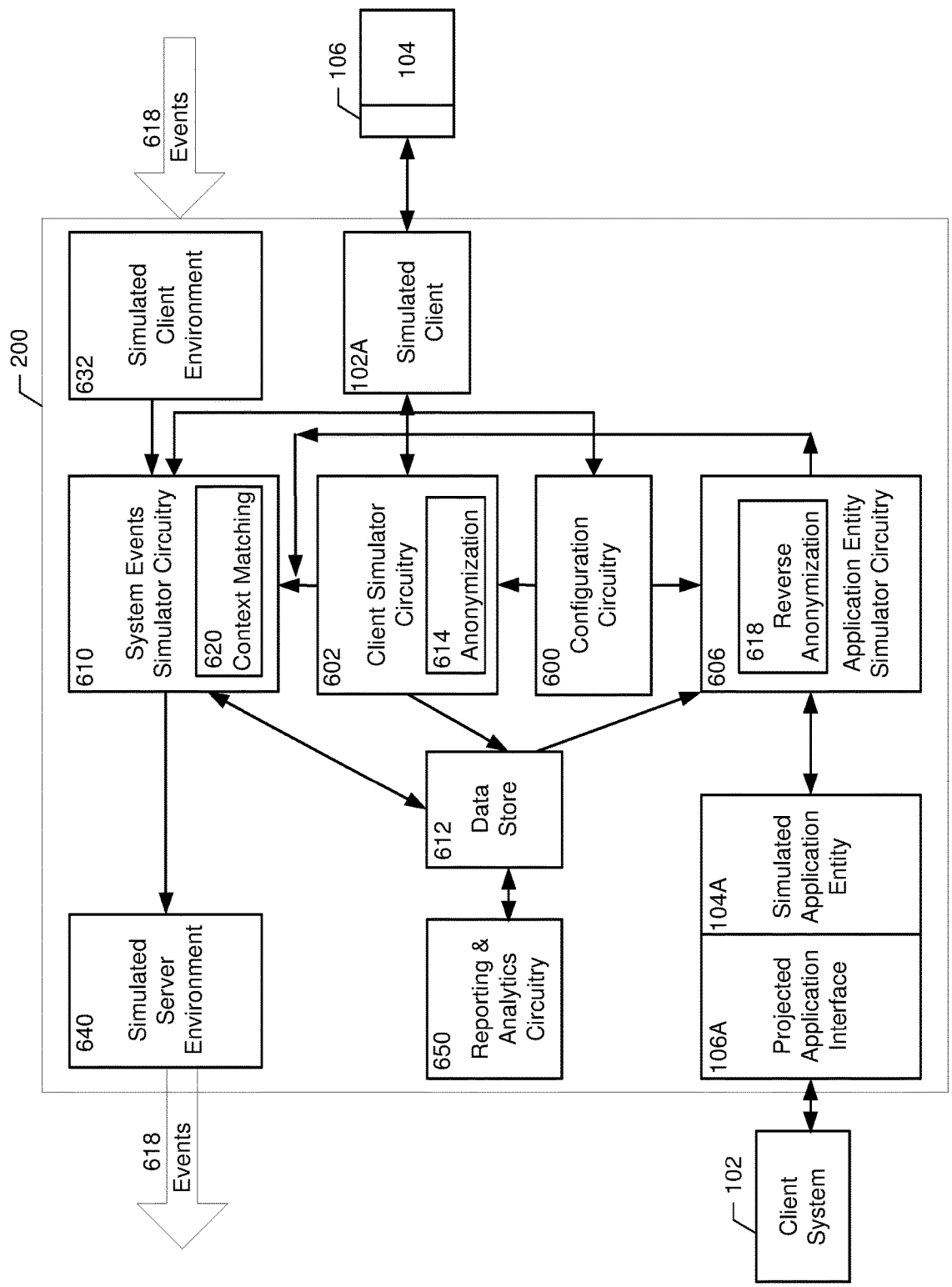

FIGS. 4 and 5 are flowcharts illustrating operations according to some example embodiments; and FIG. 6 is a block diagrams of a system according to some example embodiments.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout.

As used herein, where a computing device is described herein to receive data from another computing device, it will be appreciated that the data may be received directly from the other computing device and/or may be received indirectly via one or more intermediary computing devices, such as, for example, one or more servers, relays, routers, network access points, and/or the like. Similarly, where a computing device is described herein to transmit data to other computing device, it will be appreciated that the data may be sent directly to the other computing device or may be sent to the other computing device via one or more interlinking computing devices, such as, for example, one or more servers, relays, routers, network access points, and/or the like.

FIG. 1 illustrates a system for facilitating communication between a client system 102 and application entity 104 via an application interface 106. The application interface 106 may define method names, input parameters and/or types to be provided to the application entity 104, and/or output parameters and/or types to be returned to the client system 102. In general, the client system 102 makes requests via the application interface 106 to the application entity 104, which may be hosted by a server. The application entity 104 processes requests and provides a response to the client system 102 via the application interface 106. The client system 102 may further process responses from the application entity 104 and/or provide information via a user interface such as via a user terminal (e.g., personal computing device), for example.

The application entity 104 and/or application interface 106 may comprise computer program code, and may be stored on the memory of one or more computing devices such as a server. The client system 102 may access the application entity 104 by communicating over a network with application interface 106. Although only one client system 102 is illustrated in FIGS. 1 and 2, any number of client systems 102 may be configured to access the application entity 104 via the application interface 106.

The server or computing device hosting the application entity 104 and/or application interface 106 may operate independently from client system 102 and/or under different ownership than that of the client system 102, but it will be appreciated that in some embodiments, the application entity 104 may indeed be operated, separately, but nonetheless by the same entity in control of the client system 102. In some embodiments, the application interface 106 may be installed on the client system 102, and optionally configured for the client system 102.

FIG. 2 illustrates a variation of the system of FIG. 1, which further includes a simulation apparatus 200 according to some example embodiments, and is described in further detail hereinafter. In general, the simulation apparatus 200 allows for testing integration of the client system 102 with the application interface 106 without necessarily requiring a direct connection between the client system 102 and the application interface 106. In this regard, the simulation apparatus 200 may enable testing integration while minimizing risks that may otherwise cause performance degradation, impact data integrity, and/or the like, on the client system 102 and/or application entity 104. Further, multiple client systems 102 may be tested using the simulation apparatus 200. In some embodiments, simulation apparatus 200 may be implemented on the same server, computing device, and/or system as that of the application entity 104. Example embodiments of simulation apparatus 200 are described in further detail below.

FIG. 3 illustrates an example apparatus 300 that may implement any of the client system 102, application entity 104, application interface 106, and/or simulation apparatus 200, in accordance with some example embodiments. However, it should be noted that the components, devices, and elements illustrated in and described with respect to FIG. 3 below may not be mandatory and thus some may be omitted in certain embodiments. For example, FIG. 3 illustrates a user interface 316, as described in more detail below, which may be optional in the client system 102, application entity 104, application interface 106, and/or simulation apparatus 200. Additionally, some embodiments may include further or different components, devices, or elements beyond those illustrated in and described with respect to FIG. 3.

It will be further appreciated that any of the client system 102, application entity 104, application interface 106, and/or simulation apparatus 200 may be any computing device such as a server, server cluster, one or more network nodes, distributed system, cloud based entity, some combination thereof, and/or the like, and may comprise any number of apparatuses 300.

Continuing with FIG. 3, processing circuitry 310 may be configured to perform actions in accordance with one or more example embodiments disclosed herein. In this regard, the processing circuitry 310 may be configured to perform and/or control performance of one or more functionalities of client system 102, application entity 104, application interface 106, and/or simulation apparatus 200 in accordance with various example embodiments. The processing circuitry 310 may be configured to perform data processing, application execution, and/or other processing and management services according to one or more example embodiments. In some embodiments, client system 102, application entity 104, application interface 106, simulation apparatus 200, or a portion(s) or component(s) thereof, such as the processing circuitry 310, may be embodied as or comprise a circuit chip. The circuit chip may constitute means for performing one or more operations for providing the functionalities described herein.

In some example embodiments, the processing circuitry 310 may include a processor 312, and in some embodiments, such as that illustrated in FIG. 3, may further include memory 314. The processing circuitry 310 may be in communication with or otherwise control a user interface 316, and/or a communication interface 318. As such, the processing circuitry 310 may be embodied as a circuit chip (e.g., an integrated circuit chip) configured (e.g., with hardware, software, or a combination of hardware and software) to perform operations described herein.

The processor 312 may be embodied in a number of different ways. For example, the processor 312 may be embodied as various processing means such as one or more of a microprocessor or other processing element, a coprocessor, a controller, or various other computing or processing devices including integrated circuits such as, for example, an ASIC (application specific integrated circuit), an FPGA (field programmable gate array), or the like. Although illustrated as a single processor, it will be appreciated that the processor 312 may comprise a plurality of processors. The plurality of processors may be in operative communication with each other and may be collectively configured to perform one or more functionalities of client system 102, application entity 104, application interface 106, and/or simulation apparatus 200 as described herein. The plurality of processors may be embodied on a single computing device or distributed across a plurality of computing devices collectively configured to function as client system 102, application entity 104, application interface 106, and/or simulation apparatus 200. In some example embodiments, the processor 312 may be configured to execute instructions stored in the memory 314 or otherwise accessible to the processor 312. As such, whether configured by hardware or by a combination of hardware and software, the processor 312 may represent an entity (e.g., physically embodied in circuitry—in the form of processing circuitry 310) capable of performing operations according to embodiments of the present invention while configured accordingly. Thus, for example, when the processor 312 is embodied as an ASIC, FPGA, or the like, the processor 312 may be specifically configured hardware for conducting the operations described herein. Alternatively, as another example, when the processor 312 is embodied as an executor of software instructions, the instructions may specifically configure the processor 312 to perform one or more operations described herein.

In some example embodiments, the memory 314 may include one or more non-transitory memory devices such as, for example, volatile and/or non-volatile memory that may be either fixed or removable. In this regard, the memory 314 may comprise a non-transitory computer-readable storage medium. It will be appreciated that while the memory 314 is illustrated as a single memory, the memory 314 may comprise a plurality of memories. The plurality of memories may be embodied on a single computing device or may be distributed across a plurality of computing devices. The memory 314 may be configured to store information, data, applications, computer program code, instructions and/or the like for enabling client system 102, application entity 104, application interface 106, and/or simulation apparatus 200 to carry out various functions in accordance with one or more example embodiments. For example, when apparatus 300 is implemented as simulation apparatus 200, memory 314 may store data records associated with simulated requests and responses.

The memory 314 may be configured to buffer input data for processing by the processor 312. Additionally or alternatively, the memory 314 may be configured to store instructions for execution by the processor 312. In some embodiments, the memory 314 may include one or more databases that may store a variety of files, contents, or data sets. Among the contents of the memory 314, applications may be stored for execution by the processor 312 to carry out the functionality associated with each respective application. In some cases, the memory 314 may be in communication with one or more of the processor 312, user interface 316, and/or communication interface 318, for passing information among components of client system 102, application entity 104, application interface 106, and/or simulation apparatus 200.

The optional user interface 316 may be in communication with the processing circuitry 310 to receive an indication of a user input at the user interface 316 and/or to provide an audible, visual, mechanical, or other output to the user. As such, the user interface 316 may include, for example, a keyboard, a mouse, a joystick, a display, a touch screen display, a microphone, a speaker, and/or other input/output mechanisms. As such, the user interface 316 may, in some example embodiments, provide means for user control of managing or processing data access operations and/or the like. In some example embodiments in which client system 102, application entity 104, application interface 106 and/or simulation apparatus 200 is embodied as a server, cloud computing system, or the like, aspects of user interface 316 may be limited or the user interface 316 may not be present.

The communication interface 318 may include one or more interface mechanisms for enabling communication with other devices and/or networks. In some cases, the communication interface 318 may be any means such as a device or circuitry embodied in either hardware, or a combination of hardware and software that is configured to receive and/or transmit data from/to a network and/or any other device or module in communication with the processing circuitry 310. By way of example, the communication interface 318 may be configured to enable communication among client system 102, application entity 104, application interface 106 and/or simulation apparatus 200 over a network. Accordingly, the communication interface 318 may, for example, include supporting hardware and/or software for enabling wireless and/or wireline communications via cable, digital subscriber line (DSL), universal serial bus (USB), Ethernet, or other methods.

The network in which apparatus 300 and/or any of the components described herein may operate (e.g., client system 102, application entity 104, application interface 106, or simulation apparatus 200, and/or the like) may include a local area network, the Internet, any other form of a network, or in any combination thereof, including proprietary private and semi-private networks and public networks. The network may comprise a wired network and/or a wireless network (e.g., a cellular network, wireless local area network, wireless wide area network, some combination thereof, and/or the like).

FIGS. 4 and 5 are flowcharts illustrating example operations of a simulation apparatus 200 according to some example embodiments. In general, FIG. 4 is a flowchart illustrating example operations for simulating a client system, and FIG. 5 is a flowchart for simulating an application entity and corresponding application interface. In the below description of the flowcharts, further reference is made to FIG. 6, which is a block diagram of a system and simulation apparatus 200 according to some example embodiments.

As indicated in FIG. 6, the simulation apparatus 200 may include circuitry, which may be implemented by the processing circuitry 310 or may be implemented separately from the processing circuitry 310, but may be configured to operate in concert therewith. As such, the various circuitry of FIG. 6 may be embodied in the same manner that the processing circuitry 310 is described including both hardware implementations and implementations in which a processor is configured to operate in accordance with computer programming code stored in a memory device to perform the respective function.

Performance of the operations by the simulation apparatus 200 as described herein may result in the simulated entities illustrated in FIG. 6. For example, the simulation apparatus 200 may simulate the client system and client environment, as well as the application entity and associated server environment.

As shown by operation 400 of FIG. 4, simulation apparatus 200 may, when operating to simulate client system 102, include means, such as configuration circuitry 600, processor 312, memory 314, communication interface 318, and/or the like, for configuring the application interface 106. In this regard, the configuration circuitry 600 may import application interfaces such as application interface 106. As another example, the configuration circuitry 600 may enable manual configuration of the application interface 106 such as with a user interface 316. Examples of manual configuration include the user providing a user input by, for example, selecting, keying in, and/or visually dragging/dropping components. For example, the user may indicate an interface type, interface name, and/or input parameter names/types. In some embodiments, there may be a similar manual configuration used by the system events simulator circuitry 610 in defining the simulated entities (their interfaces and outputs) (described in further detail below).

Example embodiments support different types of application interfaces such as application program interfaces (APIs) and web services including but not limited to: C# library, Fast Healthcare Interoperability Resources (FHIR), cross-enterprise document sharing (XDS), Web API, Representational state transfer (REST), and/or Simple Object Access Protocol (SOAP).

As shown by operation 402 of FIG. 4, simulation apparatus 200 may include means, such as configuration circuitry 600, client simulator circuitry 602, processor 312, memory 314, communication interface 318, and/or the like, for accessing a set of input parameters and a scheduling configuration. The input parameters may be preconfigured in a source file, database, or any other format and may be stored on memory 314. The input parameters may be configured to cover a broad range of possible input parameters to the application interface 106, and may include a broad range of scenarios, permutations, or combinations of input parameters. It will be appreciated that the input parameters may be optionally anonymized with anonymization circuitry 614, described in further detail below.

The scheduling configuration may indicate various time intervals and/or configured periods of time at which the requests to the application entity 104 (via the application interface 106) may be transmitted. The scheduling of requests may be configured with configuration circuitry 600, user interface 316, and/or the like, for example. The scheduling may be configured such that requests are sent at various times of day and various days of the week. For example, a subset or all of the requests may be scheduled to be transmitted every hour and every day of the week over a period of several days. The scheduling configuration allows the simulation apparatus 200 to make requests at different days and times to account for varying response times (e.g., latency) which may depend on other network activity, some or all of which may occur on predictable or scheduled days or times.

According to example embodiments, as shown by operation 404, simulation apparatus 200 may, when performing operations to simulate the client system 102, include means, such as configuration circuitry 600, client simulator circuitry 602, processor 312, memory 314, communication interface 318, and/or the like, for transmitting a plurality of requests to the application entity 106 via the application interface 104 at times according to the scheduling configuration, wherein the plurality of requests comprise respective input parameters. The simulation apparatus 200 may also record the times the requests are transmitted in order to track latency, as described in further detail below. Information relating to the request may be stored in a request record such that subsequently received responses, response times and/or the like can be associated with or included the request record. The request record may include input parameters and/or context data associated with the request. Request records are described in further detail below.

The application interface 106 and application entity 104 process the requests accordingly and return responses to the simulation apparatus 200. At operation 406, simulation apparatus 200 may include means, such as client simulator circuitry 602, processor 312, memory 314, communication interface 318, and/or the like, for monitoring for responses from the application interface 106.

At operation 408, simulation apparatus 200 may include means, such as client simulator circuitry 602, data store 612, processor 312, memory 314, communication interface 318, and/or the like, for storing received output data and latency times in association with the respective request record, wherein the request records correspond to requests and comprise at least the input parameters and context data. In this regard, the request record that comprises input parameters and/or context data associated with the request transmitted in operation 404 may be associated with, or may be updated to include, the received output data and/or latency times.

The output data received from the application interface 106 may be stored in a format associated with the application interface 106 and response type ((e.g., JavaScript Object Notation (JSON), serialized data, etc.) to the data store 612, which may be embodied by memory 314.

Examples of context data include but are not limited to application entity version, a temporal characteristic (e.g., time and/or day the request was transmitted), and environment information (e.g., hosting machine operating system, amount of total or available random access memory (RAM), etc.). Any context data may be stored as a part of, or in association with the request record including the input parameters, and the received output from the application interface 106.

At operation 410, simulation apparatus 200 may include means, such as system events simulator circuitry 610, processor 312, memory 314, data store 612, communication interface 318, and/or the like, for tracking events triggered by performance of requests by the application entity 104.

According to some embodiments, when the client simulator circuitry 602 makes a request to the application interface 106, other events (e.g., events 618) may be triggered. The transmission of a request to application interface 106 may result in requests to additional application interfaces 106 (not illustrated) and/or additional application entities 104 (not illustrated). For example, a request and/or its associated input parameters may depend on another request and/or that request's parameters.

To simulate this environment, the configuration circuitry 600 configures the client simulator circuitry 602 to communicate with the system events simulator circuitry 610. Specifically, the configuration may allow an application interface 106 to have a dependency on another application interface 106 (not illustrated), and/or a dependent input parameter's value to come from another parent's input or respective output parameter's value. Therefore, when a request is made, and output is stored for the parent application interface, all or some dependent application interfaces may also be invoked and the response data may be stored.

For example, a parent application interface may return patient data, and a dependent application interface may return study data associated with the list of study identifiers from the patient data. The events may be recorded into the data store 612 via the systems event simulator circuitry 610.

Example events include Health Level Seven International (HL7) messages, Digital Imaging and Communications in Medicine (DICOM) messages, REST calls, Windows Communication Foundation (WCF) Service calls, and/or the like.

For example, in some embodiments, in a server environment of the application entity 104, possible event sources, such as other application entities 104 within the simulated server environment 640, may be configured to communicate with the systems event simulator circuitry 610. When the client simulator circuitry 602 performs a request, it may communicate the context of the request (for example: an assigning authority, patient medical record number, a study accession number, etc.) to the systems event simulator circuitry 610. The systems event simulator circuitry 610 may receive events generated by a server system of the application entity 104, and perform matching or near matching of the contexts in a request to an event. This may be performed with context matching component 620. The events that have a matching or similar context may then be recorded in the data store 612. Since a format of the request and events can be different (e.g., HL7, DICOM, REST, WCF, etc.), context matching may include identification, extraction, and normalization of the context within each item. The context matching may therefore filter out irrelevant data and may allow for proper association of the event data to the request (which may be utilized for accurate simulation of the server).

For example, given a request executed for a specified patient ABC, the following events may be triggered: 'event-1' for patient ABC, 'event-1' for patient XYZ, 'event-2' for patient ABC, and 'event-1' for patient 123. In this example, systems event simulator circuitry 610 may only store 'event-1' and 'event-2' for ABC. Subsequently, as described in further detail with respect to operation 506 below, a similar request (e.g., with similar parameters of previously simulated request) would result in simulation of the 'event-1' and 'event-2' of the specified patient.

In this regard, the server environment is simulated (640 in FIG. 6).

In some embodiments, the client simulator circuitry 602 may include an optional anonymization component 614 that can be configured to skip anonymization, perform irreversible anonymization, and/or perform anonymization on specific output parameters and/or patterns within the input parameters while performing the operations described above.

In some embodiments, a third-party library (e.g., MITRE identification Scrubber Toolkit (MIST)) may be used to anonymize the data. The configuration circuitry 600 may in some embodiments, enable a user to indicate via user interface 316, for example, whether the data should be anonymized. The anonymization component 614 may therefore be utilized in conjunction with any of the above operations 402, 404, 406 and/or 408. For example, the simulation apparatus 200 may anonymize input parameters provided in calls to the application interface 106, and/or anonymize output data that is returned and stored.

By recording the data in the data store 612 as described with respect to FIG. 4 above, the simulation apparatus 200 provides a simulated client 102A and simulated client environment 632.

Once example embodiments have recorded data in the data store via the client simulator circuitry 602, the simulation apparatus 200 can present a projected application interface 106A (matching, closely matching, or simulating the application interface 106) and return data to client system 102 via the application entity simulator circuitry 606. In this regard, and as further described with respect to FIG. 5 below, the simulation apparatus 200 simulates the application entity 104.

As shown by operation 500, the simulation apparatus 200 may, when performing operations to simulate an application entity 104 with corresponding application interface 106, include means, such as client simulator circuitry 602, processor 312, memory 314, communication interface 318, and/or the like, for projecting the application interface 106 for access by the client system 102. In this regard, the configured application interface 106 may be replicated or made accessible to the client system 102. Specifically, the client system 102 may connect and communicate with the projected application interface 106A in the same way, or a similar way, as the client system 102 would communicate with application interface 106.

As shown by operation 502, the simulation apparatus 200 may include means, such as application entity simulator circuitry 606, data store 612, processor 312, memory 314, communication interface 318, and/or the like, for, in response to a client request from the client system 102, identifying at least one request record as a representative record. In this regard, the application entity simulator circuitry 606 may access the data store 612 and identify records having the same or similar input parameters and/or context data as provided in the request from client system 102.

Similar request records may be identified based on having all, or at least some, input parameters in common with the client request. As another example, a representative request may be identified based on similarities between input parameters. For example, if the input parameters are quantifiable, input parameters may be identified as similar if they fall within a predefined range, or within a measurable variation from one another. Examples of identifying a representative record may include identifying a record having a similar patient type or characteristics, including but not limited to non-content based similarities such as age, gender, height, weight, and/or the like. In some examples, identifying a representative record may include identifying a record having a similar study type such as one having a same modality, similar number of images, within a predefined range of images, and/or the like.

A representative record may also be identified based on having a same or similar context as the client request. For example, the application entity simulator circuitry 606 may consider a temporal characteristic by identifying a record for a request made at the same day or time as, or within a predefined range of time (e.g., within 30 minutes) of, the client request.

Other context data may also be considered in identifying representative records. For example, application entity simulator circuitry 606 may identify representative records by identifying records associated with a same or similar application entity version, environment information such as hosting machine operating system, amount of total or available RAM, and/or the like.

As shown by operation 504, the simulation apparatus 200 may include means, such as, projected application interface 106A, entity simulator circuitry 606, processor 312, memory 314, communication interface 318, and/or the like, for causing a simulated response to be provided to the client system based on the stored received output and the respective latency time associated with the at least one representative record. The entity simulator circuitry 606 may return the stored output data based on the recorded associated latency, artificially delaying the response to the client system 102 based on the client request.

For example, a request from the client system 102 to projected application interface 106A at 1 PM on a Monday may return data corresponding to a request that was made at approximately 1 PM on a Monday against the application interface 106. The response latency may closely replicate a response time of the similar request, or may be an average of all the recorded latencies for responses captured at 1 PM on Mondays.

Additionally or alternatively, if a client request results in identification of multiple representative records, the latency and/or output data returned by the software entity simulator circuitry may be manually chosen or preconfigured with configuration circuitry 600. The latency and stored output data may be chosen based on a specific item or based on specific characterization(s). Some example configurations may include the following requirements for selecting the records to utilize from multiple representative records:

1) Use the latency and/or output data from the stored record at July 1, 20xx 12 pm (or within 30 minutes of 12 pm).

2) Use the latency and output data from the stored record having the highest latency.

3) Use the latency and output data from the oldest stored record from Hospital ABC (e.g., a particular instance of application entity 104 and/or an application entity 104 in communication with a particularly database associated with Hospital ABC).

4) Use the output data from the most recent stored record from a Windows 2008 Server with 64 GB of RAM. For latency, use the average of all the identified representative records.

5) Use the output data from the most recent stored record that has >=200 notes and >=30 reports. For latency, use the smallest latency value.

In some embodiments, the application entity simulator circuitry 606 may modify the value of a parameter(s) of the returned output data so that the transmitted value(s) differ from that of the stored parameter value(s). In this regard, the configuration circuitry 600 may provide for configuration of an application interface's output parameter. Specifically, the configuration may allow an output parameter's value to come from either the data store 612, a hard-coded value, and/or a derived value (e.g., from the input parameters and/or other source such as but not limited to user input, for example).

It will be appreciated that an optional reverse anonymization component 618 may be present in the application entity simulator circuitry 606, and may be configured to perform reverse anonymization on specific output parameters and/or patterns within the parameter data. A third-party library (e.g., MIST) may be used to de-anonymize the data stored in anonymized form. The output may be the same as the inputs that were communicated to the client simulator circuitry 602. This may enable simulation apparatus 200 to store the data securely (anonymized), but allow utilization and/or communication of the data in its original form.

Further, the events tracked by the system events simulator circuitry 610 may be utilized in the simulated responses. As shown by operation 506, the simulation apparatus 200 may include means, such as projected application interface 106A, entity simulator circuitry 606, processor 312, memory 314, communication interface 318, and/or the like, for further in response to a client request from the client system, simulating an event such as those tracked by the system events simulator circuitry 610.

In some embodiments, when the application entity simulator circuitry 606 services a request, the application entity simulator circuitry 606 communicates the context of the request to the systems event simulator circuitry 610. The context matching component 620 may identify stored events that may occur given the same or similar context of the request from the client system 102. The stored relevant events that were caused by the request can be processed and/or transmitted by the system event simulator circuitry 610. In this way, the client system 102 may receive indications of other events that may have originated due to the request. The events may be sent to any other client systems 102 configured to receive communication from event sources on the application entity 104.

As shown by operation 508, the simulation apparatus 200 may include means, such as reporting and analytics circuitry 650, processor 312, memory 314, communication interface 318, and/or the like, for providing reporting and analytics data. As data is recorded, the reporting and analytics circuitry 650 may be used to gain insights to client and application entity integration. For example, reporting and analytics circuitry 650 may indicate the performance differences of an application interface 106 between different client sites, times of day, different request characteristics, and/or the like.

Many technical advantages are provided by example embodiments of the simulation apparatus 200. Example embodiments may simulate accurate delay and/or latencies of the application interface 106 in an early phase of development. This may further provide for early detection and correction of issues. The simulation apparatus 200 may record data for a 24-hour period, or greater, and may use simulations for endurance testing.

Further, after initial recording of data, example embodiments of the method and apparatus may de-couple dependencies on the application interface 106 and application entity 104, which may otherwise be subject to access restrictions. This allows for easier validation and troubleshooting of integration with the client system 102.

Additionally or alternatively, the simulation apparatus 200 may accurately simulate the data and events within a system given different requests to an application interface 106 and/or during different environment contexts.

Example embodiments of simulation apparatus 200 further provide for generating performance data relating to the application interface 106 and an existing client system site/environment that has similar characteristics to a potential client system site. For example, simulation apparatus 200 allows for comparison of systems within a clinical cohort, including profile matching and comparison. This allows initial profiling of a site and/or environment so that information is accessible to other groups or functions including engineering, product, sales groups prior to any installation, setup, testing, etc. Example embodiments further provide for client site and application version analytics to compare performance metrics to those associated with other versions.

As a result, the simulation apparatus 200 promotes early detection and troubleshooting of defects caused by integration, without negatively impacting the application entity 106 and causing inadvertent performance issues to other dependent systems or clients.

It will be appreciated that the figures are each provided as examples and should not be construed to narrow the scope or spirit of the disclosure in any way. In this regard, the scope of the disclosure encompasses many potential embodiments in addition to those illustrated and described herein. Numerous other configurations may also be used to implement embodiments of the present invention.

FIGS. 4 and 5 illustrate operations of a method, apparatus, and computer program product according to some example embodiments. It will be understood that each operation of the flowcharts or diagrams, and combinations of operations in the flowcharts or diagrams, may be implemented by various means, such as hardware and/or a computer program product comprising one or more computer-readable mediums having computer readable program instructions stored thereon. For example, one or more of the procedures described herein may be embodied by computer program instructions of a computer program product. In this regard, the computer program product(s) which embody the procedures described herein may comprise one or more memory devices of a computing device (for example, memory 314) storing instructions executable by a processor in the computing device (for example, by processor 312). In some example embodiments, the computer program instructions of the computer program product(s) which embody the procedures described above may be stored by memory devices of a plurality of computing devices. As will be appreciated, any such computer program product may be loaded onto a computer or other programmable apparatus (for example, client system 102, application entity 104, application interface 106, simulation apparatus 200 and/or apparatus 300) to produce a machine, such that the computer program product including the instructions which execute on the computer or other programmable apparatus creates means for implementing the functions specified in the flowchart block(s). Further, the computer program product may comprise one or more computer-readable memories on which the computer program instructions may be stored such that the one or more computer-readable memories can direct a computer or other programmable apparatus to function in a particular manner, such that the computer program product may comprise an article of manufacture which implements the function specified in the flowchart block(s). The computer program instructions of one or more computer program products may also be loaded onto a computer or other programmable apparatus (for example, client system 102, application entity 104, application interface 106, simulation apparatus 200 and/or other apparatus) to cause a series of operations to be performed on the computer or other programmable apparatus to produce a computer-implemented process such that the instructions which execute on the computer or other programmable apparatus implement the functions specified in the flowchart block(s).

Accordingly, blocks of the flowcharts support combinations of means for performing the specified functions and combinations of operations for performing the specified functions. It will also be understood that one or more blocks of the flowcharts, and combinations of blocks in the flowcharts, can be implemented by special purpose hardware-based computer systems which perform the specified functions, or combinations of special purpose hardware and computer instructions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A method for simulating communication between a client system and an application entity via an application interface, the method comprising:
   accessing a set of input parameters and a scheduling configuration;
   transmitting a plurality of requests to the application entity via the application interface according to the scheduling configuration, wherein the plurality of requests comprise respective input parameters;
   monitoring for responses from the application interface,
   storing received output data and respective latency times in association with respective request records, wherein the request records correspond to requests and comprise at least the input parameters and context data;
   present a projected application interface that simulates the application interface for access by the client system;
   in response to receiving a client request from the client system via the projected application interface, identifying at least one of the request records as a representative record; and
   causing a simulated response to be provided to the client system via the projected application interface based on the stored received output and the respective latency time associated with the at least one representative record.

2. The method of claim 1, further comprising:
   tracking events triggered by performance of requests by the application entity; and
   further in response to the client request received from the client system via the projected application interface, simulating at least one event.

3. The method of claim 1, wherein the context data comprises a temporal characteristic, and the at least one representative record is identified based on the temporal characteristic.

4. The method of claim 1, further comprising:
   determining an artificial latency based on average latency times of a plurality of representative records, wherein the simulated response is provided to the client system via the projected application interface based on the artificial latency.

5. The method of claim 1, further comprising:
   determining an artificial latency based on a highest latency time of a plurality of representative records, wherein the simulated response is provided to the client system via the projected application interface based on the artificial latency.

6. The method of claim 1, further comprising:
   providing reporting and analytics data.

7. The method of claim 1, further comprising:
   performing anonymization of at least one of the output data.

8. A computer program product for simulating communication between a client system and an application entity via an application interface, the computer program product comprising at least one non-transitory computer-readable medium having computer-readable program instructions stored therein, the computer-readable program instructions comprising instructions, which when performed by a simulation apparatus, are configured to cause the simulation apparatus to at least:
   access a set of input parameters and a scheduling configuration;
   transmit a plurality of requests to the application entity via the application interface according to the scheduling configuration, wherein the plurality of requests comprise respective input parameters;
   monitor for responses from the application interface,
   store received output data and respective latency times in association with respective request records, wherein the request records correspond to requests and comprise at least the input parameters and context data;
   present a projected application interface that simulates the application interface for access by the client system;
   in response to a client request received by the simulation apparatus from the client system via the projected application interface, identify at least one request record as a representative record; and
   cause a simulated response to be provided to the client system via the projected application interface based on the stored received output and the respective latency time associated with the at least one representative record.

9. The computer program product of claim 8, wherein the computer-readable program instructions further comprise instructions, which when performed by the simulation apparatus, are configured to cause the simulation apparatus to at least:
   track events triggered by performance of requests by the application entity; and
   further in response to the client request from the client system, simulate at least one event.

10. The computer program product of claim 8, wherein the context data comprises a temporal characteristic, and the at least one representative record is identified based on the temporal characteristic.

11. The computer program product of claim 8, wherein the computer-readable program instructions further comprise instructions, which when performed by the simulation apparatus, are configured to cause the simulation apparatus to at least:
   determine an artificial latency based on average latency times of a plurality of representative records, wherein the simulated response is provided based on the artificial latency.

12. The computer program product of claim 8, wherein the computer-readable program instructions further comprise instructions, which when performed by the simulation apparatus, are configured to cause the simulation apparatus to at least:
   determine an artificial latency based on a highest latency time of a plurality of representative records, wherein the simulated response is provided based on the artificial latency.

13. The computer program product of claim 8, wherein the computer-readable program instructions further comprise instructions, which when performed by the simulation apparatus, are configured to cause the simulation apparatus to at least:
   provide reporting and analytics data.

14. The computer program product of claim 8, wherein the computer-readable program instructions further comprise instructions, which when performed by the simulation apparatus, are configured to cause the simulation apparatus to at least:
   perform anonymization of at least one of the output data.

15. An apparatus for simulating communication between a client system and an application entity via an application interface, the apparatus comprising processing circuitry configured to cause the apparatus to at least:
   access a set of input parameters and a scheduling configuration;

transmit a plurality of requests to the application entity via the application interface according to the scheduling configuration, wherein the plurality of requests comprise respective input parameters;

monitor for responses from the application interface, store received output data and respective latency times in association with respective request records, wherein the request records correspond to requests and comprise at least the input parameters and context data;

present a projected application interface that simulates the application interface for access by the client system;

in response to a client request from the client system via the projected application interface, identify at least one request record as a representative record; and cause a simulated response to be provided to the client system via the projected application interface based on the stored received output and the respective latency time associated with the at least one representative record.

16. The apparatus according to claim 15, wherein the processing circuitry is further configured to cause the apparatus to at least:

track events triggered by performance of requests by the application entity; and further in response to the client request from the client system, simulate at least one event.

17. The apparatus according to claim 15, wherein the context data comprises a temporal characteristic, and the at least one representative record is identified based on the temporal characteristic.

18. The apparatus according to claim 15, wherein the processing circuitry is further configured to cause the apparatus to at least:

determine an artificial latency based on average latency times of a plurality of representative records, wherein the simulated response is provided based on the artificial latency.

19. The apparatus according to claim 15, wherein the processing circuitry is further configured to cause the apparatus to at least:

determine an artificial latency based on a highest latency time of a plurality of representative records, wherein the simulated response is provided based on the artificial latency.

20. The apparatus according to claim 15, wherein the processing circuitry is further configured to cause the apparatus to at least:

provide reporting and analytics data.

* * * * *